(12) United States Patent
Xia

(10) Patent No.: US 6,992,698 B1
(45) Date of Patent: Jan. 31, 2006

(54) INTEGRATED FIELD EMISSION ARRAY SENSOR, DISPLAY, AND TRANSMITTER, AND APPARATUS INCLUDING SAME

(75) Inventor: Zhongyi Xia, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/386,906

(22) Filed: Aug. 31, 1999

(51) Int. Cl.
*H04N 5/225* (2006.01)
*H01J 1/02* (2006.01)
*H01L 29/06* (2006.01)

(52) U.S. Cl. .................... 348/207.99; 313/309; 257/10
(58) Field of Classification Search ........... 348/207.99; 345/74.1, 75.2, 76; 313/483, 506, 306, 309, 313/495; 315/167, 169.3, 161; 257/10
See application file for complete search history.

(56) References Cited

U.S. PATENT DOCUMENTS

| | | |
|---|---|---|
| 3,466,485 A | 9/1969 | Arthur, Jr. et al. |
| 3,814,968 A | 6/1974 | Nathanson et al. |
| 3,931,633 A | 1/1976 | Shannon et al. |
| 3,970,887 A | 7/1976 | Smith et al. |
| 4,265,989 A | 5/1981 | Tateishi et al. |
| 4,303,930 A | 12/1981 | Van Gorkom et al. |
| 4,370,797 A | 2/1983 | Van Gorkom et al. |
| 4,513,308 A | 4/1985 | Greene et al. |
| 4,609,947 A | 9/1986 | Yamagiwa et al. |
| 4,801,994 A | 1/1989 | Van Gorkom et al. |
| 5,121,193 A | 6/1992 | Nishimura et al. |
| 5,260,794 A | 11/1993 | Sase et al. |
| 5,304,815 A | 4/1994 | Suzuki et al. |
| 5,343,244 A | 8/1994 | Sase et al. |
| 5,591,986 A | 1/1997 | Niigaki et al. |
| 5,646,479 A | 7/1997 | Troxell |
| 5,669,022 A | 9/1997 | Kadohara et al. |
| 5,751,049 A * | 5/1998 | Goodwin .................... 257/440 |

(Continued)

*Primary Examiner*—Wendy R. Garber
*Assistant Examiner*—Luong T. Nguyen
(74) *Attorney, Agent, or Firm*—TraskBritt, PC

(57) ABSTRACT

An image detection apparatus including a field emission array and signal transmission circuits in communication with pixels of the field emission array. The field emission array includes a p-type substrate with an array of n-wells therein. Emitter tips, in communication with the n-wells, protrude from an emission surface of the p-type substrate. A detection surface of the p-type substrate is located opposite the emission surface thereof. Each signal transmission circuit of the field emission array includes a capacitor, a baseline potential transistor, and a signal transmission transistor. A first side of the capacitor communicates with a corresponding n-well of the field emission array. A second side of the capacitor communicates with the baseline potential transistor and the signal transmission transistor. The baseline potential transistor and the signal transmission transistor may share a drain. As radiation, such as visible light or near infrared radiation, impinges the detection surface of the field emission array, electron-hole pairs are created in p-n junctions between the p-type substrate and the n-wells. As a result, electrons are transferred from the impinged p-n junctions into the n-well adjacent thereto. The charge created in the n-well represents the intensity or wavelength of the radiation that has impinged the p-n junction. A signal representative of the wavelength or intensity of the impinging radiation is transmitted by the signal transmission circuit, and may be scanned by a scan circuit. Upon applying a relatively positive potential to an extraction grid associated with the field emission array, the excess electrons in n-wells may be emitted from an emitter tip adjacent the n-well. The emitted electrons may impinge a corresponding display pixel of a display so as to create a visible image thereon.

27 Claims, 6 Drawing Sheets

U.S. PATENT DOCUMENTS

| | | |
|---|---|---|
| 5,804,833 A | 9/1998 | Stettner et al. |
| 5,818,500 A | 10/1998 | Edwards et al. |
| 5,847,407 A * | 12/1998 | Lucero et al. .............. 313/306 |
| 5,867,629 A | 2/1999 | Otsuka |
| 5,889,313 A * | 3/1999 | Parker ........................ 257/429 |
| 5,909,200 A * | 6/1999 | Hush ......................... 345/74.1 |
| 5,945,968 A * | 8/1999 | Hush ......................... 345/74.1 |
| 6,441,542 B1 * | 8/2002 | Hush et al. ................. 313/309 |

* cited by examiner

INTEGRATED FIELD EMISSION ARRAY SENSOR, DISPLAY, AND TRANSMITTER, AND APPARATUS INCLUDING SAME

BACKGROUND OF THE INVENTION

1. Field of the Invention

The present invention relates to an integrated apparatus that senses or detects electromagnetic radiation and displays the sensed or detected radiation. Particularly, the present invention relates to an apparatus that senses or detects electromagnetic radiation of visible or near infrared wavelengths and that displays the sensed or detected radiation in the form of a visible image. More particularly, the present invention relates to an apparatus that senses or detects electromagnetic radiation, displays an image representative of the sensed or detected radiation, and transmits signals representative of the detected radiation. The present invention also relates to devices that include the inventive apparatus.

2. Background of Related Art

Semiconductor devices, such as charge coupled devices ("CCDs") have long been employed to detect radiation, such as electromagnetic radiation. Charge coupled devices typically include an array of pixels, each of which includes an n-well, which is a region of n-type or n-doped silicon, in a p-type, or p-doped, silicon substrate. N-type semiconductor regions are typically relatively negatively electrically charged and conduct current by means of electrons. P-type semiconductor regions are relatively positively electrically charged and conduct current by means of electron hole pairs. The junction between the p-type substrate and the n-well, which is also referred to as a p-n junction or as a depletion region, typically has little or no mobile electrical charge. As radiation (e.g., photons) impinges the p-n junction, electron-hole pairs proportionate to the amount of radiation are created therein. Stated another way, as the p-n junction of a pixel is irradiated, electrons, or electrical impulses, move from the p-n junction into the adjacent n-well of the pixel.

Since the p-n junctions of charge coupled devices convert radiation to an electrical signal, charge coupled devices have been employed to detect radiation (e.g., electromagnetic radiation), and to transmit electrical signals representative of the detected radiation by means of circuitry associated with the pixels of these charge coupled devices. Accordingly, charge coupled devices have been used in various image detection applications, such as in digital cameras.

Some field emission arrays similarly include a p-type silicon substrate with relatively electrically conductive n-wells extending therethrough and, therefore, p-n junctions. Field emission arrays have conventionally been employed in association with cathodo-luminescent display panels, in the form of field emission displays ("FEDs"), in order to display images.

Typically, the field emission array of a field emission display includes an array of emission pixels, each of which includes one or more substantially conical emitter tips. Each of the emitter tips is electrically connected to a relatively negative voltage source, or an electron source, by means of a cathode conductor line, which is also typically referred to as a column line.

Another set of electrically conductive lines, which are typically referred to as row lines or as gate lines, extend over the emission pixels of the field emission array. Row lines typically extend across a field emission display substantially perpendicularly to the direction in which the column lines extend. Accordingly, the paths of a row line and of a column line typically cross proximate (above and below, respectively) the location of one or more emitter tips. The row lines of a field emission array are electrically connected to a relatively positive voltage source. Thus, as a voltage is applied across both the column line and the row line that intersect at one or more emission pixels, electrons are emitted by the emitter tips of those emission pixels and accelerated through an opening in the row line.

As electrons are emitted by emitter tips and accelerate past the row line that extends over the emission pixel, the electrons are directed toward a corresponding display pixel of a positively charged cathodo-luminescent panel of the field emission display, which is spaced apart from and substantially parallel to the field emission array. As electrons impact a display pixel of the cathodo-luminescent panel, the display pixel is illuminated. The degree to which the display pixel is illuminated depends upon the number of electrons that impact the display pixel.

As the field emission array and its associated cathodo-luminescent display are both generally planar structures and are disposed relatively close to one another, the field emission display ("FED") devices of which the field emission array and cathodo-luminescent display are a part are typically relatively thin, flat devices. Thus, field emission displays are compact relative to display devices that include cathode ray tubes, and have found widespread use in many types of portable electronic devices, such as portable computers and video cameras, or "camcorders."

Field emission arrays have also been employed to detect radiation (e.g., electromagnetic radiation of a visible wavelength or electrons) and to transmit electrons representative of the detected radiation. Exemplary devices which employ field emission arrays in such a manner are disclosed in U.S. Pat. No. 3,466,485 (hereinafter "the '485 patent"), issued to John R. Arthur, Jr. et al. on Sep. 9, 1969; U.S. Pat. No. 3,814,968 (hereinafter "the '968 patent"), issued to Harvey C. Nathanson et al. on Jun. 4, 1974; U.S. Pat. No. 5,804,833 (hereinafter "the '833 patent"), issued to Roger Stettner et al. on Sep. 8, 1998; and U.S. Pat. No. 5,818,500 (hereinafter "the '500 patent"), issued to Jon K. Edwards et al. on Oct. 6, 1998.

The '485 patent discloses a light sensitive field emission array with emitter tips that intensify a detected light image. As light is directed toward the back side of the field emission array, photons create current in the emitter tips corresponding to the areas of the back side upon which light is directed.

The '968 patent discloses a radiation sensitive field emission array that is similar to that disclosed in the '485 patent. The emitter tips of the field emission array of the '968 patent emit electrons in response to an input radiation, such as light or electrons.

The emitted electrons are directed to a display screen that displays the detected image.

The field emission array of the '833 patent detects and displays images in a similar manner. In addition to detecting and displaying visible light images, however, the field emission array of the '833 patent can also detect electromagnetic radiation wavelengths from visible light up to far infrared wavelengths (i.e., from about 300 nm up to about $1 \times 10^6$ nm) and display images representative of electromagnetic radiation of these wavelengths. Applicable uses of such a field emission array would be in so-called "night vision" applications.

These patents do not, however, disclose field emission arrays that include components that transmit signals representative of the detected images. Thus, the radiation-sensitive field emission arrays of these patents may not be employed to detect radiation, to display images representative of the radiation, and to substantially simultaneously transmit signals representative of the radiation to another source, such as to recording componentry.

Accordingly, there is a need for a field emission array that detects radiation and substantially simultaneously displays an image representative of the detected radiation and transmits detectable signals representative of the radiation. A relatively compact apparatus that detects radiation and displays images and transmits signals that are representative of the radiation is also needed.

SUMMARY OF THE INVENTION

The integrated field emission array sensor, display, and transmitter of the present invention includes a field emission array having a semiconductor substrate with an array of n-wells and, thus, p-n junctions defined therein, an array of emitter tips adjacent and corresponding to the p-n junctions, and circuitry associated with each pixel of the array.

The field emission array substrate is preferably a semiconductive material, such as silicon. The substrate may be p-type or p-doped semiconductor material, and therefore conducts current by means of electron hole pairs (i.e., the p-type semiconductor material is relatively electron deficient).

Regions of conductively doped n-type semiconductive material, which are referred to herein as n-type semiconductor wells or simply as n-wells, are defined in the substrate. These n-wells may comprise the column lines of a field emission array. N-type semiconductive materials conduct current by means of the free electrons of a dopant material.

The interface between each n-well and the p-type semiconductor substrate of the field emission array defines a so-called "p-n junction" or "n-p junction." A depletion region, which includes relatively non-charged materials, exists at the p-n junction. Thus, as is known in the art, a contact potential exists at the p-n junction.

The back side of the substrate (i.e., p-type semiconductor material) of the field emission array comprises a radiation detection surface, which is also referred to herein as a detection surface, as a sensor surface, or as a radiation sensitive surface. As radiation such as photons (i.e., quanta of electromagnetic radiation) enter a pixel through the radiation detection surface, the radiation impedes a p-n junction of the field emission array, and electron hole pairs are created in the p-n junction.

As electron hole pairs are created in the p-n junction, a substantially proportionate number of electrons move into the n-well from the p-n junction. Thus, the voltage of the n-well decreases. The radiation detection surface is preferably shielded from further radiation until a signal representative of the radiation incident with the pixel has been transmitted.

Each pixel of the inventive apparatus includes a signal transmission circuit associated with the n-well of that pixel. The signal transmission circuit includes a capacitor, a first side of which communicates with the n-well and a second side of which is a source node of a first transistor or otherwise communicates with a source node of the first transistor. The drain node of the first transistor communicates with a baseline potential ($V_{DD}$). A second transistor shares a source node with the first transistor. The drain node of the second transistor communicates with a scan circuit of a type known in the art, such as the circuits employed in digital cameras.

As the voltage of the n-well of an emission pixel decreases, the voltage of the n-well is communicated to the first side of the capacitor. As the source node of the first transistor and, thus, the second side of the capacitor, is preferably charged to the baseline potential, the voltage at the second side of the capacitor and, thus, the voltage of the source node of the second transistor drops until it is substantially the same as the voltage of the n-well. Upon turning the second transistor "on" (i.e., upon opening the gate of the second transistor), the voltage is transferred to the drain node of the second transistor. The voltage of the second transistor, which is now substantially representative of the amount and type of radiation that impinged the p-n junction of the emission pixel, may then be measured by the scan circuit that communicates with the drain node of the second transistor. Upon turning the gate of the second transistor "off," the source node of the second transistor is electrically isolated from the voltage of the n-well. A value representative of the voltage measured by the scan circuit at the drain node of the second transistor, which represents the radiation detected by the emission pixel, may then be stored, as known in the art.

Each emission pixel of the field emission array further includes at least one emitter tip that protrudes from an emission surface of the field emission array located opposite the detection surface. The emission pixels are preferably disposed substantially over and in communication with the associated n-wells of the field emission array.

As the gate of the first transistor is opened, the source node of the first transistor and, thus, the second side of the capacitor, is charged to the baseline potential ($V_{DD}$). As a relatively positive voltage is applied to a conductive member of an extraction grid, or grid anode, overlying the emission pixel, due to the potential difference between the grid anode and the emitter tip, electrons may be drawn from the n-well, into the associated emitter tip, and emitted from the emitter tip. As the electrons are emitted from the emitter tip and through the extraction grid, they are directed toward a corresponding display pixel of an cathodo-luminescent display and illuminate the same in a manner that represents the wavelength or intensity of radiation that impinged the emission pixel that corresponds to the display pixel upon impinging the display pixel. The n-well will then return substantially to the baseline potential. Another image may be detected and a representative signal transmitted by exposing the radiation detection surface to radiation, closing the gate of the first transistor, and repeating the process.

Other features and advantages of the present invention will become apparent to those of ordinary skill in the art through consideration of the ensuing description, the accompanying drawings, and the appended claims.

DETAILED DESCRIPTION OF THE PREFERRED EMBODIMENTS

Figure 1:
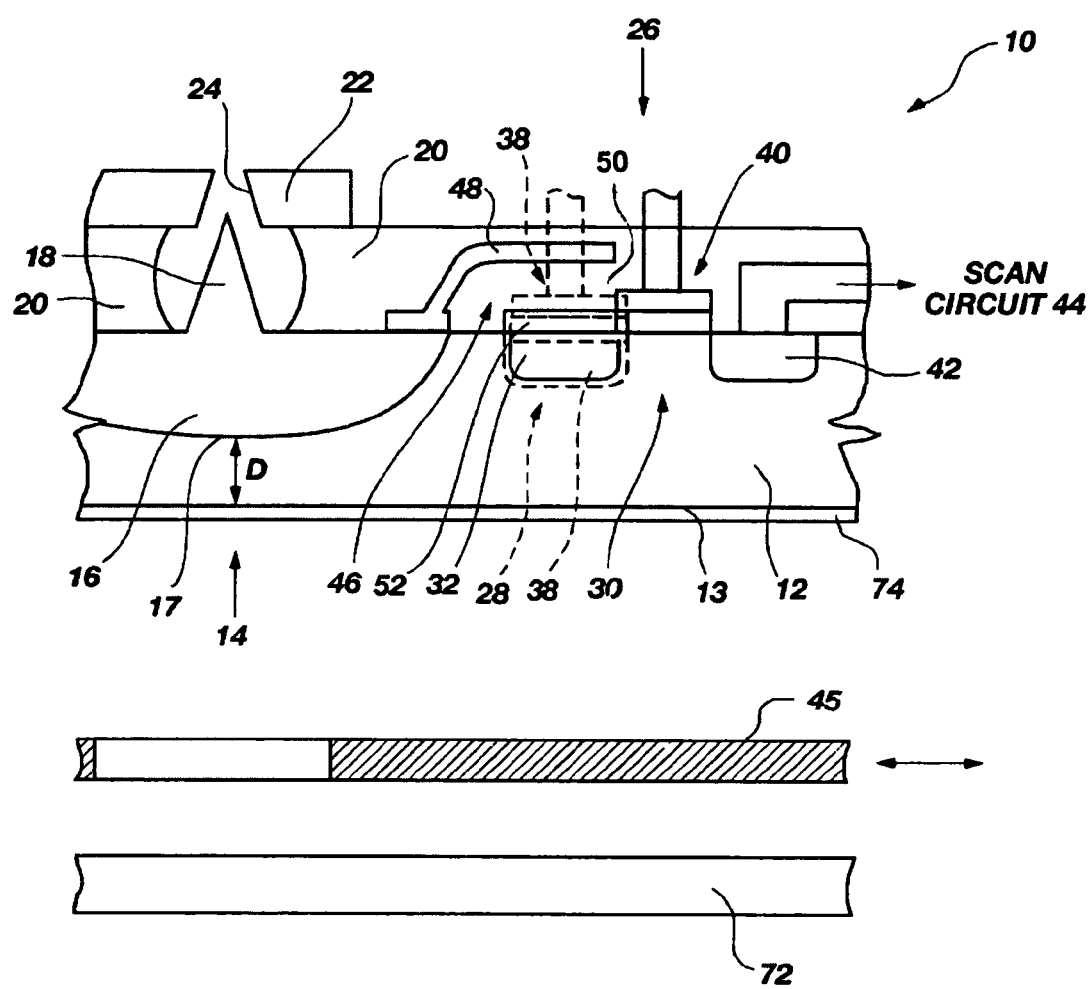
FIG. 1 is a schematic representation of a field emission array according to the present invention.

FIG. 1 illustrates an emission pixel 14 of a preferred embodiment of a field emission array 10 according to the present invention, which includes a p-type semiconductor substrate 12, such as p-type silicon, with an array of emission pixels 14 and a signal transmission circuit 26 associated with each emission pixel 14.

Each emission pixel 14 includes a region of n-type semiconductor material, which is also referred to herein as an n-well 16, such as n-type silicon, proximate an active surface of substrate 12. The interface between each n-well 16 and the surrounding p-type semiconductor material of substrate 12 defines a p-n junction 17. Preferably, the thickness D of, or shortest distance across, the p-type region of substrate 12 between each n-well 16 and the back side of substrate 12 facilitates the creation of electron hole pairs as radiation, such as photons of electromagnetic radiation, impinge p-n junction 17.

The thickness D between the back side of substrate 12 and n-well 16 preferably facilitates the generation of electron-hole pairs in p-n junction 17 by visible wavelengths of electromagnetic radiation (i.e., visible light). Thickness D may facilitate the generation of electron hole pairs in p-n junction 17 by infrared or other wavelengths of electromagnetic radiation.

Field emission array 10 also includes at least one emitter tip 18 associated with each n-well 16. Each emitter tip 18 is laterally surrounded by and, preferably, at least partially spaced apart from a layer 20 of dielectric material. An extraction grid 22, which is fabricated from an electrically conductive material, is disposed over layer 20 and, therefore, over a surface of field emission array 10. Apertures 24 formed through extraction grid 22 are located substantially above each emitter tip 18.

With continued reference to FIG. 1, the signal transmission circuit 26 associated with each emission pixel 14 includes a first transistor 28, or baseline potential transistor, which is illustrated in phantom since transistor 28 extends into or out of the plane of the page, and a second transistor 30, which is also referred to herein as a signal transmission transistor. First transistor 28 and second transistor 30 may share an n-well 32, which acts as the drain 34 (FIG. 2), or drain node, of both first transistor 28 and second transistor 30. First transistor 28 also includes a gate 36 (FIG. 2) and a source 38, or source node, both of which are illustrated in phantom. Source 38 may communicate with a drain voltage, $V_{DD}$. Second transistor 30 includes a gate 40 and a source 42, which is also referred to herein as a source node. Source 42 communicates with a scan circuit 44 of a type known in the art.

Although second transistor 30 is illustrated as a metal-oxide-semiconductor field-effect transistor ("MOSFET"), which is a type of insulated-gate field-effect transistor ("IGFET"), other types of transistors, such as a junction field-effect transistor ("JFET") may also be employed as second transistor 30. Similarly, first transistor 28 may comprise an IGFET, a JFET, or any other type of transistor.

A capacitor 46 disposed between n-well 16 and signal transmission circuit 26 facilitates the generation of a current through signal transmission circuit 26. Capacitor 46 includes a first conductive structure 48, which is a conductive contact disposed in contact with the n-well 16 of emission pixel 14, a second conductive component 52, and a dielectric component 50, such as a glass or an oxide, disposed between first conductive component 48 and second conductive component 52.

The various components of field emission array 10, including n-wells 16, emitter tips 18, capacitor 46, and signal transmission circuit 26, may be fabricated by known semiconductor device fabrication techniques.

Figure 2:
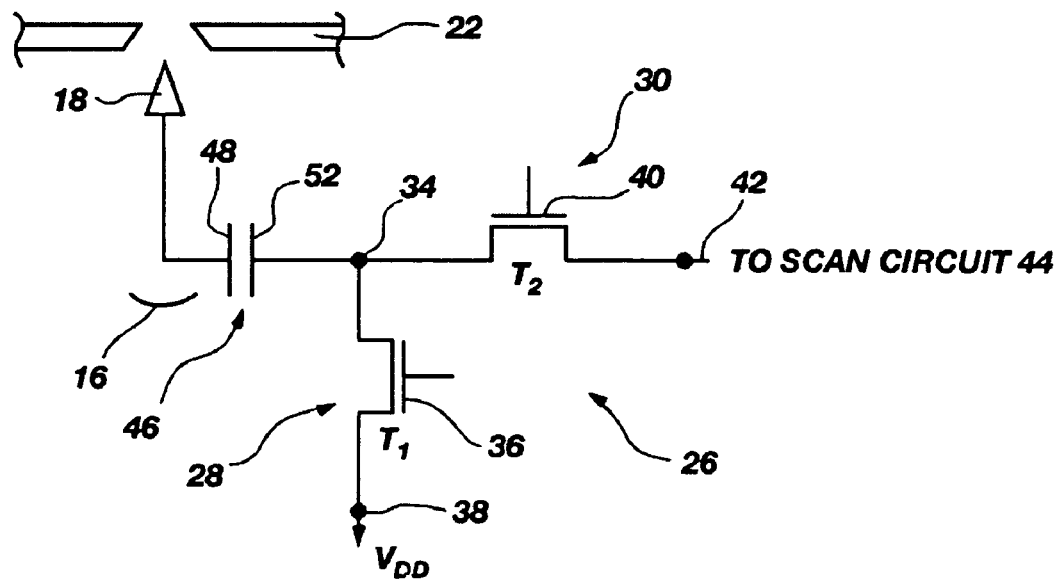
FIG. 2 schematically illustrates a circuit including transistors that may be employed in the field emission array according to the present invention.
Figure 3:
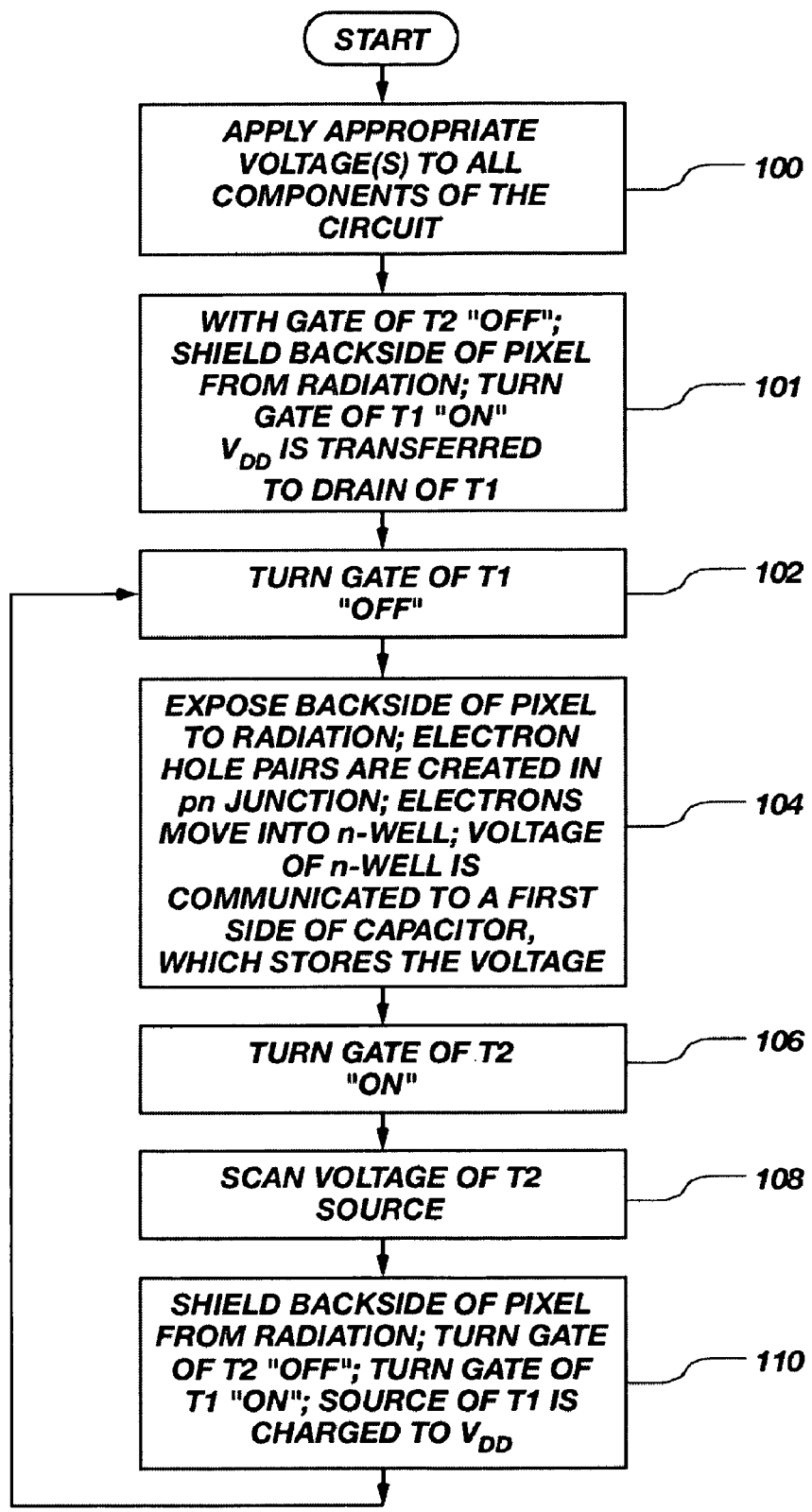
FIG. 3 is a flow chart that illustrates the method of the present invention.

With reference to FIGS. 2 and 3, and with continued reference to FIG. 1, a preferred embodiment of the radiation detection, display, and signal transmission process of the present invention is depicted. FIG. 2 is a schematic representation of the circuit defined by n-well 16, capacitor 46, and signal transmission circuit 26. FIG. 3 is a flow chart illustrating an image sensing, display, and signal transmission process according to the present invention.

While the processes of the present invention are occurring, an appropriate voltage or voltages are applied, at reference 100 of FIG. 3, to all of the components of the circuit, including extraction grid 22, the ground reference of the circuit, the substrate bias of the circuit, the circuit voltage, and the cathodo-luminescent display panel 66 (see FIG. 4), if any, is biased at a substantially constant, relatively positive voltage.

Figure 2A:
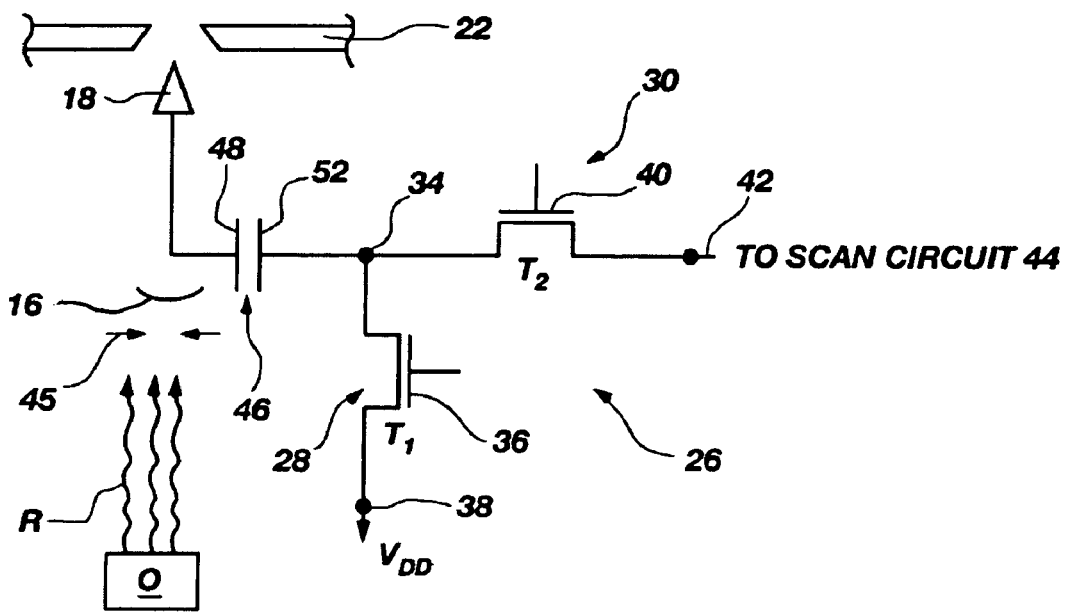
FIG. 2A schematically illustrates a variation of the circuit depicted in FIG. 2, which includes a switch between the n-well and the capacitor.

The n-well 16 and drain 34 of an emission pixel 14 are each charged to a baseline potential. Accordingly, the back side 13 of substrate 12 at emission pixel 14 is shielded from radiation, such as by a shutter 54. Alternatively, with reference to FIG. 2A, field emission array 10 may include a shutter 45. At reference 101 of FIG. 3, gate 36 of first transistor 28 is turned "on" while the back side 13 of substrate 12 at emission pixel 14 is shielded from radiation. Alternatively, with reference again to FIG. 2A, gate 36 of first transistor 28 may be turned "on" while shutter 45 of FIG. 2A is in the closed position. Shielding back side 13 or closing shutter 45 permits n-well 16 to return to its original, or base, voltage, prior to detecting radiation R from a portion of an object O. This original voltage sets the voltage difference between grid 22 and emitter tips 18 below the threshold voltage that causes emitter tips 18 to emit electrons. Therefore, as shutter 45 is closed, emitter tips 18 do not emit electrons. As gate 36 of first transistor 28 is turned "on," at reference 101 of FIG. 3, a substantially constant drain source voltage, which comprises the baseline potential ($V_{DD}$), is transferred from source 38 of first transistor 28 to drain 34. Gate 36 is then turned "off," at reference 102 of FIG. 3.

At reference 104 of FIG. 3, the back side of substrate 12 is exposed to radiation, which impinges p-n junction 17, creating electron-hole pairs representative of the intensity or type of radiation therein and causing electrons to be transferred to n-well 16. Thus, as radiation impinges p-n junction 17, the voltage of n-well 16 drops, or decreases, to create a voltage difference between grid 22 and emitter tips 18, thereby facilitating the emission of electrons from emitter tips 18. Changes in the voltage of n-well 16 are communicated to first conductive component 48 of capacitor 46, at reference 104 of FIG. 3. Thus, the voltage of n-well 16 and any changes in the voltage thereof may be communicated to a first side of capacitor 46.

As the voltage on the n-well 16 side of capacitor 46, at first conductive component 48, drops, the voltage on the drain 34 side of capacitor 46, at second conductive component 52, substantially correspondingly drops. Capacitor 46 stores the voltage of drain 34 until gate 40 of second transistor 30 is turned "on," at reference 106 of FIG. 3. As gate 40 of second transistor 30 is turned "on," the reduced voltage of drain 34 is communicated or transferred to source 42 of transistor 30, which may be scanned, at reference 108 of FIG. 3, to determine the intensity or type of radiation incident with emission pixel 14.

At reference 110 of FIG. 3, gate 40 may be turned "off" while the back side 13 of substrate 12 at emission pixel 14 remains shielded from radiation. Gate 36 of first transistor 28 is turned "on" to charge drain 34 back to $V_{DD}$, which permits n-well 16 to return substantially to its original, baseline potential.

The process may then be repeated to detect, display, and transmit a signal representative of subsequent radiation "images." Gate 36 of first transistor 28 may be turned "off" and radiation permitted to impinge the back side 13 of substrate 12 at emission pixel 14, at reference 102 of FIG. 3, to facilitate the sensing or detecting of another image of radiation by emission pixel 14 and the transmission of a signal representative of the radiation through second transistor 30.

As the apparatus of present invention comprises a field emission array having an array of n-wells, each of the n-wells preferably has a signal transmission circuit associated therewith. Accordingly, radiation may be detected by each n-well of the apparatus, or by each emission pixel thereof, and signals representative of the radiation detected at each of the pixels may be transmitted to a scan circuit, or image processing circuit, of a type known in the art, associated with each of the signal transmission circuits. The scanned and processed data may then be recorded by known processes.

Figure 4:
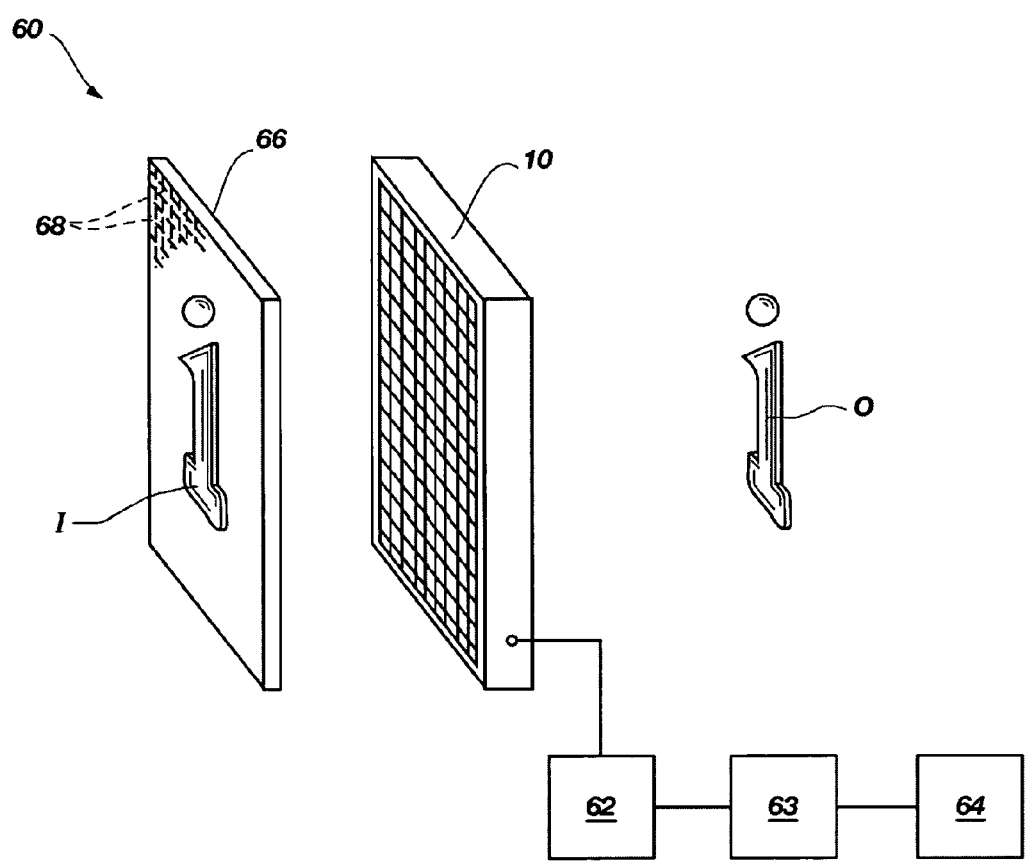
FIG. 4 is a schematic representation of a system wherein a field emission array according to the present invention is employed to detect radiation, to display images representative of the detected radiation; and to transmit signals representative of a magnitude or amount and a wavelength or type of the detected radiation.

With reference to FIG. 4, a system 60 is shown, which includes field emission array 10, a scan circuit 62 associated with field emission array 10, a processor 63 in communication with scan circuit 62, a recording mechanism 64 in communication with processor 63, a substantially flat display panel 66, or cathodo-luminescent display, spaced apart from field emission array 10 in substantially mutually parallel relation therewith, and other components, as known in the art.

Scan circuit 62 is preferably an image signal detector of a type known in the art, which detects or measures the charge or potential at source 42 (see FIGS. 1 and 2) of the second transistor 30 of each of the emission pixels 14 of field emission array 10. Processor 63, which is preferably of a type known in the art, communicates with scan circuit 62 to convert the voltage measured at each emission pixel 14 to data representative of the wavelength or the intensity of the radiation impinging emission pixel 14. Recording mechanism 64, which is also preferably of a type known in the art, communicates with processor 63 and records or stores the data representative of the wavelength or intensity of radiation impinging emission pixel 14 along with the location of the emission pixel 14 from which the data was obtained.

Display panel 66 includes an array of display pixels 68, each of which are positioned to correspond to an emission pixel 14 of field emission array 10. In use, cathodo-luminescent display panel 66 is charged to a relatively positive attraction potential, which is greater than the relatively positive potential of extraction grid 22 so as to attract electrons emitted from the emitter tips 18 of field emission array 10, and which generates image light as electrons are attracted thereto.

FIG. 4 depicts the detection of electromagnetic radiation of or reflected by an object O and the display of an image I of object O by system 60. Preferably, electromagnetic radiation from object O is focused on back side 13 of substrate by one or more optical lenses (see, e.g., optical lens 72 in FIGS. 1 and 5B). As back side 13 (see FIG. 1) of substrate 12 is exposed to electromagnetic radiation from object O, emission pixels 14 are exposed to different wavelengths and intensities of electromagnetic radiation from the different portions of object O to which each emission pixel 14 is exposed.

The wavelength and intensity of the radiation from each portion of object O impinging a corresponding emission pixel 14 of field emission array 10 is translated to a corresponding electrical impulse in the manner described in reference to FIGS. 2 and 3. These electrical impulses are measured by a scan circuit 62 of a type known in the art. Processor 63 processes the measurements taken by scan circuit 62, which may be recorded for each of the emission pixels 14 of field emission array 10 by recording mechanism 64, as known in the art. Thus, recording mechanism 64 stores an array of information representative of the radiation from object O to which back side 13 of substrate 12 of field emission array 10 is exposed.

The emitter tip or tips 18 of each emission pixel 14 emit electrons in a manner that represents the wavelength and the intensity of the portion of radiation from object O to which emission pixel 14 is exposed. These electrons are emitted upon application of a relatively positive potential to extraction grid 22, as described above in reference to FIGS. 2 and 3. Thus, electrons representative of object O are emitted from the emission pixels 14 of field emission array 10 as emission pixels 14 are exposed to radiation from object O. These emitted electrons impinge display pixels 68 of display 66, eliminating display pixels 68 that correspond to emission pixels 14 that have been exposed to a portion of the radiation from object O. Thus, display 66 displays an image I representative of object O.

As an alternative to or in combination with recording mechanism 64, system 60 may include an image transmission mechanism of a type known in the art, which transmits signals representative of radiation from object O to a storage device, an output device, a processor, or another device which may store, process, interpret, or otherwise utilize the signals of scan circuit 62.

Although system 60 is depicted in FIG. 4 as including a display 66 associated with field emission array 10, system 60 need not include such a display. If system 60 does not include display 66, image I may be displayed by other components associated with scan circuit 64.

Figure 5A:
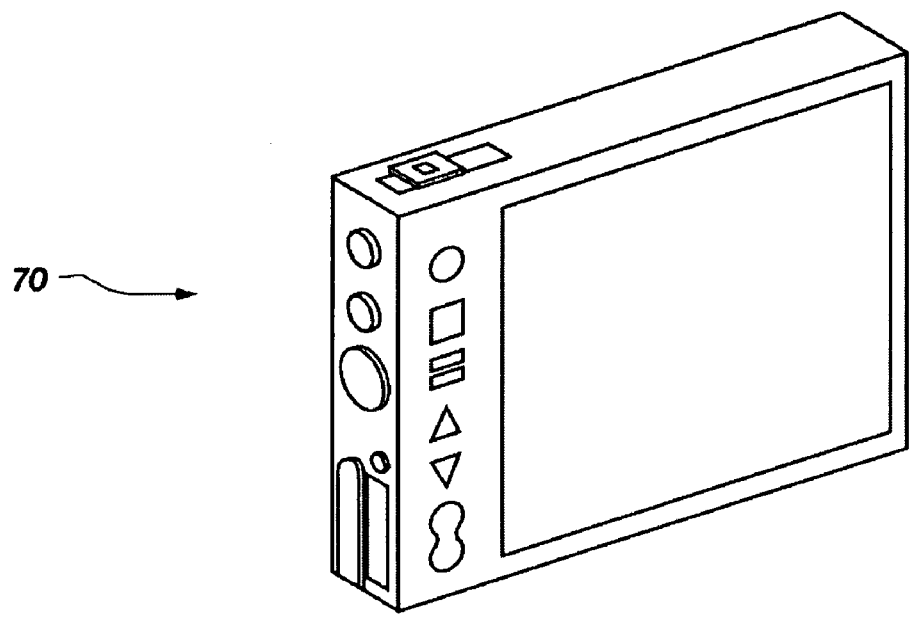
FIGS. 5A and 5B are front and rear schematic representations, respectively, of a video camera including a field emission array according to the present invention which depicts the use thereof to detect radiation, to display images representative of the detected radiation, and to transmit and record signals representative of the detected radiation.
Figure 5B:
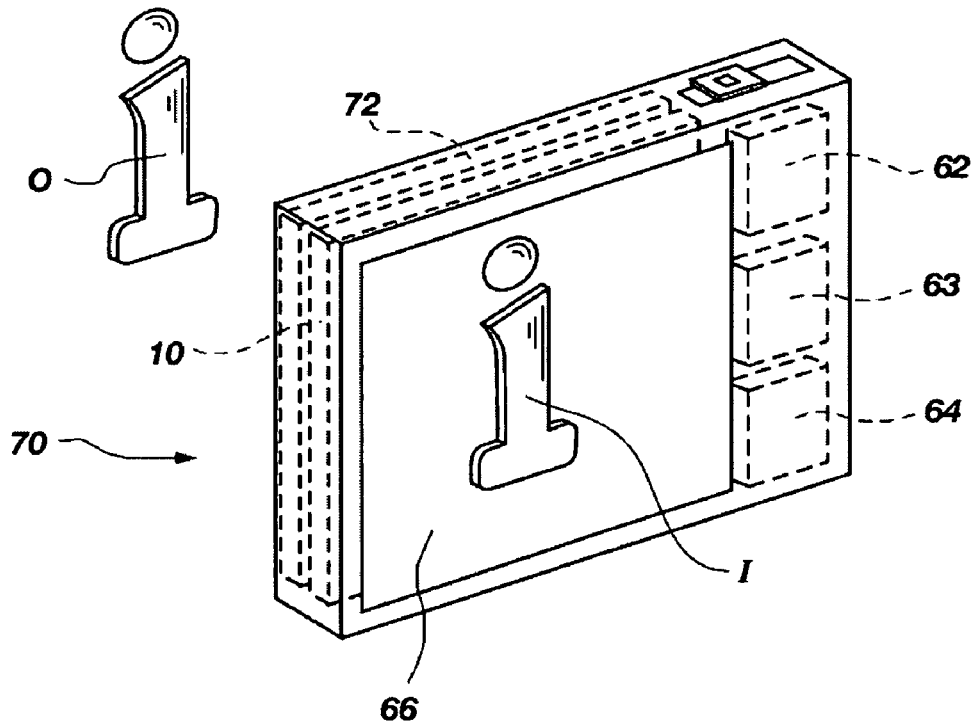

System 60 may be employed to detect a series of images and measure the wavelengths and intensities of portions of each image of the series of images incident with each emission pixel 14 of field emission array 10. These measured wavelengths and intensities at each emission pixel 14 may be stored for each image of the series of images. Since scan circuit 62 identifies the emission pixel 14 that detects the radiation of a portion of an image, information representative of radiation impinging each emission pixel 14 of field emission array 10 is stored. Since this information may be stored on an image-by-image basis, a video representative of a series of images may be stored and played back. Thus, as shown in FIGS. 5A and 5B, the system 60 (see FIG. 4) of the present invention may be employed in a video camera 70. Of course, video camera 70 also includes one or more optical lenses 72 that focus electromagnetic radiation from an object O onto back side 13 of substrate 12 of field emission array 10 (see FIG. 1) and other components, as known in the art.

If field emission array 10 is capable of detecting infrared wavelengths of electromagnetic radiation, system 60 or an image detection system similar thereto may also be used in apparatus for detecting or displaying infrared images. For example, system 60 could be used in night-vision goggles.

A silicon substrate by itself has too high a band gap to detect longer wavelengths (e.g. 2,500 to 10,000 nm) of electromagnetic radiation. Accordingly, referring again to FIG. 1, field emission array 10 may optionally include a substrate 12 of low band gap material, which is also referred to herein as a "detection enhancement material," of a type known in the art to enhance detection of longer wavelengths of electromagnetic radiation by field emission array 10. Low band gap materials, such as mercury-cadmium-tellurium alloys and other materials having electrical characteristics that are more readily altered than those of silicon by electromagnetic radiation of relatively long wavelengths, may be used as substrate 12 to facilitate the detection or display infrared radiation in thermal imaging applications or longer wavelengths of electromagnetic radiation. Detection enhancement materials such as mercury-cadmium-tellurium facilitate the detection by field emission array 10 of wavelengths of electromagnetic radiation of from about 1,000 nm to about 10,000 nm and greater.

Figure 1A:
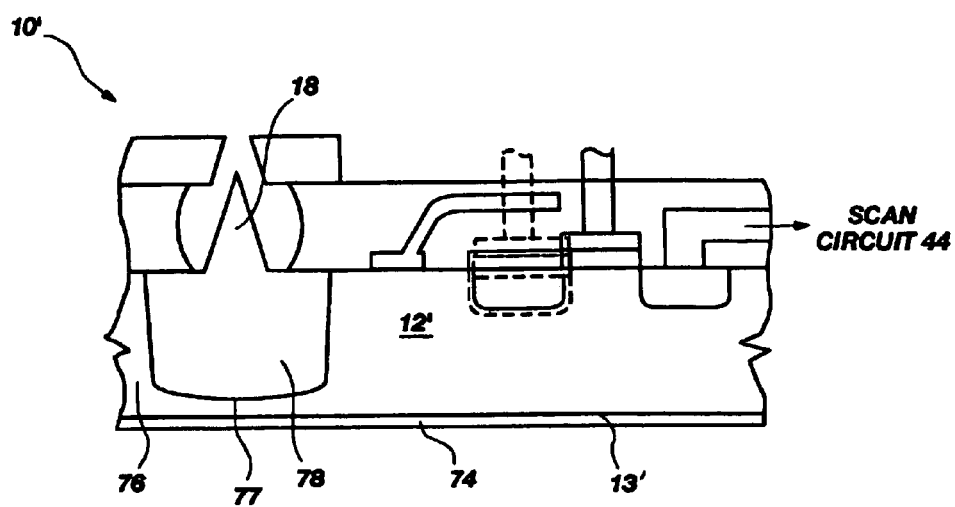
FIG. 1A is a schematic representation of a field emission array according to the present invention, which includes a detection enhancement material to facilitate the detection infrared and longer wavelengths of electromagnetic radiation.

Alternatively, with reference to FIG. 1A, a field emission array 10' configured to detect wavelengths of electromagnetic radiation that are longer than visible light can include a silicon substrate 12' with a p-type region 76 (e.g., p-type silicon) having a p-type conductivity and an n-type region 78 (e.g., n-doped silicon) having an n-type conductivity. A diffusion region 77, or p-n junction, is located between p-type region 76 and back side 13' of substrate 12' and is proximate to back side 13'. A coating 74, or layer, of detection enhancement material disposed on back side 13' proximate to diffusion region 77 facilitates the detection of radiation, the scanning of electrical impulses representative of the detected radiation, and the emission of electrons representative of the detected radiation in a manner similar to the detection, scanning, and emission effected by p-n junction 17 of semiconductor substrate 12. Alternative embodiments of field emission array 10', as well as examples of useful low band gap materials and dopant concentrations, are disclosed in U.S. patent application Ser. No. 09/358,863, the disclosure of which is hereby incorporated in its entirety by this reference.

Although the foregoing description contains many specifics and examples, these should not be construed as a limiting the scope of the present invention, but merely as providing illustrations of some of the presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein and which fall within the meaning of the claims are to be embraced within their scope.

What is claimed is:

1. A video imaging system, comprising:
a field emission array including:
   a p-type substrate comprising an image detection surface;
   an n-well recessed in the p-type substrate;
   a diffusion region between the p-type substrate and the n-well;
   at least one emitter tip disposed in communication with the n-well;
   a capacitor, a first side of which is in communication with the n-well;
   a baseline potential transistor in communication with a second side of the capacitor; and
   a signal transmission transistor in communication with the second side of the capacitor;
an image signal detector associated with the signal transmission transistor; and
an extraction grid disposed over the field emission array and including at least one aperture therethrough located substantially over the at least one emitter tip.

2. The video imaging system of claim 1, further comprising a cathodo-luminescent display disposed substantially parallel to and spaced apart from the extraction grid and including at least one display pixel corresponding to the at least one emitter tip.

3. The video imaging system of claim 1, wherein the baseline potential transistor and the signal transmission transistor share a common drain.

4. The video imaging system of claim 1, wherein a distance between the image detection surface and the n-well facilitates detection of electromagnetic radiation of a near infrared wavelength.

5. The video imaging system of claim 1, wherein a distance between the image detection surface and the n-well facilitates detection of electromagnetic radiation of a visible wavelength.

6. The video imaging system of claim 1, wherein the image signal detector is in communication with a source node of the signal transmission transistor.

7. The video imaging system of claim 1, further comprising a shutter component.

8. The video imaging system of claim 7, wherein the shutter component is configured to prevent electromagnetic radiation from impinging the n-well.

9. The video imaging system of claim 1, wherein the diffusion region is located proximate to the image detection surface and further comprising a layer of detection enhancement material adjacent the image detection surface.

10. The video imaging system of claim 9, wherein the detection enhancement material comprises a platinum silicide.

11. The video imaging system of claim 1, wherein the p-type substrate and the n-well each comprise a detection enhancement material.

12. The video imaging system of claim 11, wherein the detection enhancement material comprises a mercury-cadmium-tellurium alloy.

13. An image detection apparatus, comprising:
a p-type substrate comprising an emission surface, an array of n-type wells disposed in the p-type substrate substantially along a plane proximate the emission surface, a p-n junction between the p-type substrate and each n-well of the array of n-type wells, and an image detection surface opposite the emission surface;

an array of emission pixels, each comprising at least one emitter tip protruding from the emission surface and in communication with a corresponding n-well of the array of n-type wells;

a capacitor in communication with selected n-wells of the array of n-type wells;

a signal transmission transistor in communication with the capacitor;

a baseline potential transistor in communication with the capacitor; and an image signal detector in communication with the signal transmission transistor.

14. The apparatus of claim 13, wherein the signal transmission transistor and the baseline potential transistor share a drain node.

15. The apparatus of claim 13, wherein the image signal detector communicates with a source node of the signal transmission transistor.

16. The apparatus of claim 13, further comprising a shutter.

17. The apparatus of claim 16, wherein the shutter prevents electromagnetic radiation from penetrating selected n-wells of the array of n-type wells.

18. The apparatus of claim 16, wherein the shutter is positionable over a selected region of the image detection surface.

19. The apparatus of claim 13, wherein a distance between the image detection surface and an n-well of the array of n-type wells facilitates impingement of the p-n junction by electromagnetic radiation of an infrared or a near infrared wavelength.

20. The apparatus of claim 13, wherein a distance between the image detection surface and an n-well of the array of n-wells facilitates impingement of the p-n junction by electromagnetic radiation of a visible wavelength.

21. The apparatus of claim 13, further comprising a display disposed adjacent, substantially parallel to, and spaced apart from the emission surface.

22. The apparatus of claim 21, wherein the display comprises an array of display pixels, each display pixel of which corresponds substantially to at least one emission pixel of the array of emission pixels.

23. The apparatus of claim 21, wherein the display comprises a cathodo-luminescent display.

24. The apparatus of claim 13, wherein the p-n junction is located proximate to the image detection surface, the apparatus further comprising a layer of detection enhancement material adjacent the image detection surface.

25. The apparatus of claim 24, wherein the detection enhancement material comprises a platinum silicide.

26. The apparatus of claim 13, the p-type substrate and the array of n-type wells each comprise a detection enhancement material.

27. The apparatus of claim 26, wherein the detection enhancement material comprises a mercury-cadmium-tellurium alloy.

* * * * *

UNITED STATES PATENT AND TRADEMARK OFFICE
CERTIFICATE OF CORRECTION

PATENT NO. : 6,992,698 B1 Page 1 of 1
APPLICATION NO. : 09/386906
DATED : January 31, 2006
INVENTOR(S) : Zhongyi Xia It is certified that error appears in the above-identified patent and that said Letters Patent is hereby corrected as shown below:

COLUMN 6, LINE 40, change "shutter 54" to --shutter 45--

Signed and Sealed this

Twenty-third Day of October, 2007

JON W. DUDAS
*Director of the United States Patent and Trademark Office*